(12) United States Patent
Deshpande et al.

(10) Patent No.: US 7,166,540 B2
(45) Date of Patent: Jan. 23, 2007

(54) METHOD FOR REDUCING ASSEMBLY-INDUCED STRESS IN A SEMICONDUCTOR DIE

(75) Inventors: Nitin A. Deshpande, Chandler, AZ (US); Sandeep B. Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/072,112

(22) Filed: Mar. 3, 2005

(65) Prior Publication Data

US 2006/0199299 A1    Sep. 7, 2006

(51) Int. Cl.
*H01L 21/31* (2006.01)
(52) U.S. Cl. .................................... 438/759
(58) Field of Classification Search ............. 438/106, 438/108, 110–114, 127, 197, 199, 206, 212, 438/229, 231–234, 262, 299, 301, 305–306, 438/455, 458–460, 464–465, 584, 586, 588, 438/597–599, 612, 618, 622
See application file for complete search history.

(56) References Cited

U.S. PATENT DOCUMENTS

| | | | | |
|---|---|---|---|---|
| 5,672,548 A | * | 9/1997 | Culnane et al. | 438/118 |
| 5,919,329 A | * | 7/1999 | Banks et al. | 156/281 |
| 6,015,722 A | * | 1/2000 | Banks et al. | 438/108 |
| 6,117,797 A | * | 9/2000 | Hembree | 438/759 |
| 6,617,683 B2 | * | 9/2003 | Lebonheur et al. | 257/707 |
| 6,724,078 B1 | * | 4/2004 | Sur et al. | 257/704 |
| 2005/0151268 A1 | * | 7/2005 | Boyd et al. | 257/778 |

* cited by examiner

*Primary Examiner*—Michael Lebentritt
*Assistant Examiner*—Andre' Stevenson
(74) *Attorney, Agent, or Firm*—Blakely, Sokoloff, Taylor & Zafman LLP

(57) ABSTRACT

A method and apparatus for mounting semiconductor die and integral heat spreader are disclosed. In one embodiment, thermal expansion of the integral heat spreader is restricted by physical constraints during the process of heating interface material that bonds the integral heat spreader and semiconductor die together. In an alternative embodiment, thermal expansion of the integral hat spreader is restricted by applying an external compressive force to the integral heat spreader while heating interface material that bonds the integral heat spreader and semiconductor die together.

16 Claims, 5 Drawing Sheets

METHOD FOR REDUCING ASSEMBLY-INDUCED STRESS IN A SEMICONDUCTOR DIE

FIELD OF THE INVENTION

Embodiments of the present invention relate generally to semiconductor technology and more specifically to semiconductor packaging.

BACKGROUND OF THE INVENTION

Current semiconductor device trends—higher frequencies, smaller die size, and increased power—are all contributing to increased heat being generated by integrated circuits (ICs). Too much heat can corrupt the IC's data and/or cause it to fail. Conventional methods for addressing heating effects include thinning the IC's semiconductor substrate (semiconductor die) and/or using passive thermal management structures, such as heat sinks and integral heat spreaders (IHS) in IC packages.

Shown in FIG. 1 is a cross-sectional view of an IC package 100 that includes an IHS 116, heat sink 118, and semiconductor die 106. Here, the die 106 is mounted (topside down) to a substrate 102 so that bond pads on the die 106 can electrically connect with traces on the substrate 102 by way of controlled collapse chip connection (C4) bumps 108 (i.e., the die 106 is flip-chip mounted to the substrate 102). Underfill material 110 occupies regions between the die 106 and the substrate 102, and fillets 112 (i.e. excess underfill material) are formed along the sidewalls of the die 106. Traces on the die side of the substrate 102 electrically connect with traces on the opposite side of the substrate 102 by way of plated-through-holes and/or vias (not shown). The traces on the opposite side of the substrate 102 electrically connect to an external printed circuit board by way of solder balls 104. The package shown here is commonly referred to as a ball grid array (BGA) package.

The die 106 is attached to integral heat spreader 116 by way of a thermal-interface material (TIM) 114. The heat sink 118 can be coupled to the IHS 116 by way of a combination mechanical clamp and thermal grease TIM (not shown). Heat dissipates from the die 106 to the heat sink 118 by way of TIM 114 and IHS 116. During a typical IC package assembly process, die 106 is attached to the substrate 102 (by way of C4 bumps 108 and underfill material 109) and then the combination die 106/substrate 102 are attached to the IHS 116 using the TIM 114. This sequence can present problems for very thin ICs because (1) they are fragile and susceptible to breakage during handling and (2) excess underfill material (fillets 112) can contaminate the bottomside (IHS-side) of the die 106. This contamination can interfere with the TIM's ability to conduct heat and/or form defects that can contribute to die 106 breakage during the IHS 116 mounting process.

These problems can be avoided by reversing the sequence of assembly (i.e. mounting IHS 116 to the die 106 first and then mounting the combination die 106/IHS 116 to the substrate 102). However, this requires that the TIM (typically an indium solder) have a higher melting point than the C4 bumps (typically a lead-tin solder). One TIM solder material being investigated to replace indium is gold-tin. Gold-tin solder has a higher melting point (MP) than lead-tin solder (the MP of gold-tin solder is approximately two-hundred eighty degrees Celsius and the MP of lead-tin solder is approximately one hundred eighty three degrees Celsius). However, the melting point of the gold-tin solder is so high that coefficient of thermal expansion (CTE) mismatch problems between the die 106 and the IHS 116 during the die 106 and IHS 116 bonding process are intensified to the point where cooling-induced contraction of the IHS 116 can produce stresses that negatively impact the packaged IC's operation. These stresses can, among other things (1) distort the shape of the die 106, thereby changing its physical characteristics and impacting its performance, and (2) induce delamination of the TIM 117, thereby impeding its ability to transfer heat into the IHS 116. Ultimately, these can all affect the packaged IC's yield, speed, and/or reliability.

Figure 1:
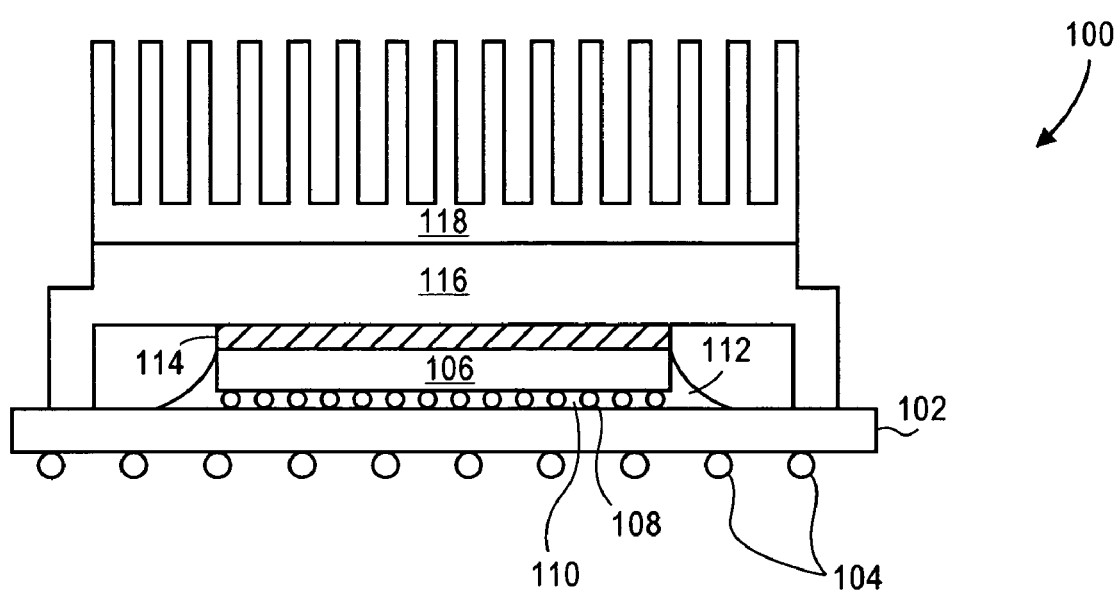
FIG. 1 illustrates a cross-sectional view of a portion of a semiconductor device package that includes an integral heat spreader and a semiconductor die.

It will be appreciated that for simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method and apparatus for assembling semiconductor die and integral heat spreaders are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

To the extent that free expansion of an integral heat spreader (IHS) is allowed during the heating/bonding of an IHS and a semiconductor die, coefficient-of-thermal-expansion (CTE) mismatch between the two can produce significant amounts of compressive stress in the semiconductor die upon cooling. This is because the IHS (typically copper) can have a higher CTE than the semiconductor die (typically silicon) and therefore the IHS expands/contracts faster and to a greater amount than the semiconductor die when heated. Since the die is bonded/attached to the IHS via the TIM, its shape/size can be impacted by the larger and more dominating contraction of the IHS. One embodiment of the present invention constrains thermal expansion of the IHS while it is being heated. This can reduce cooling-induced compressive stress in the die as compared to conventional die/IHS bonding processes.

Figure 2:
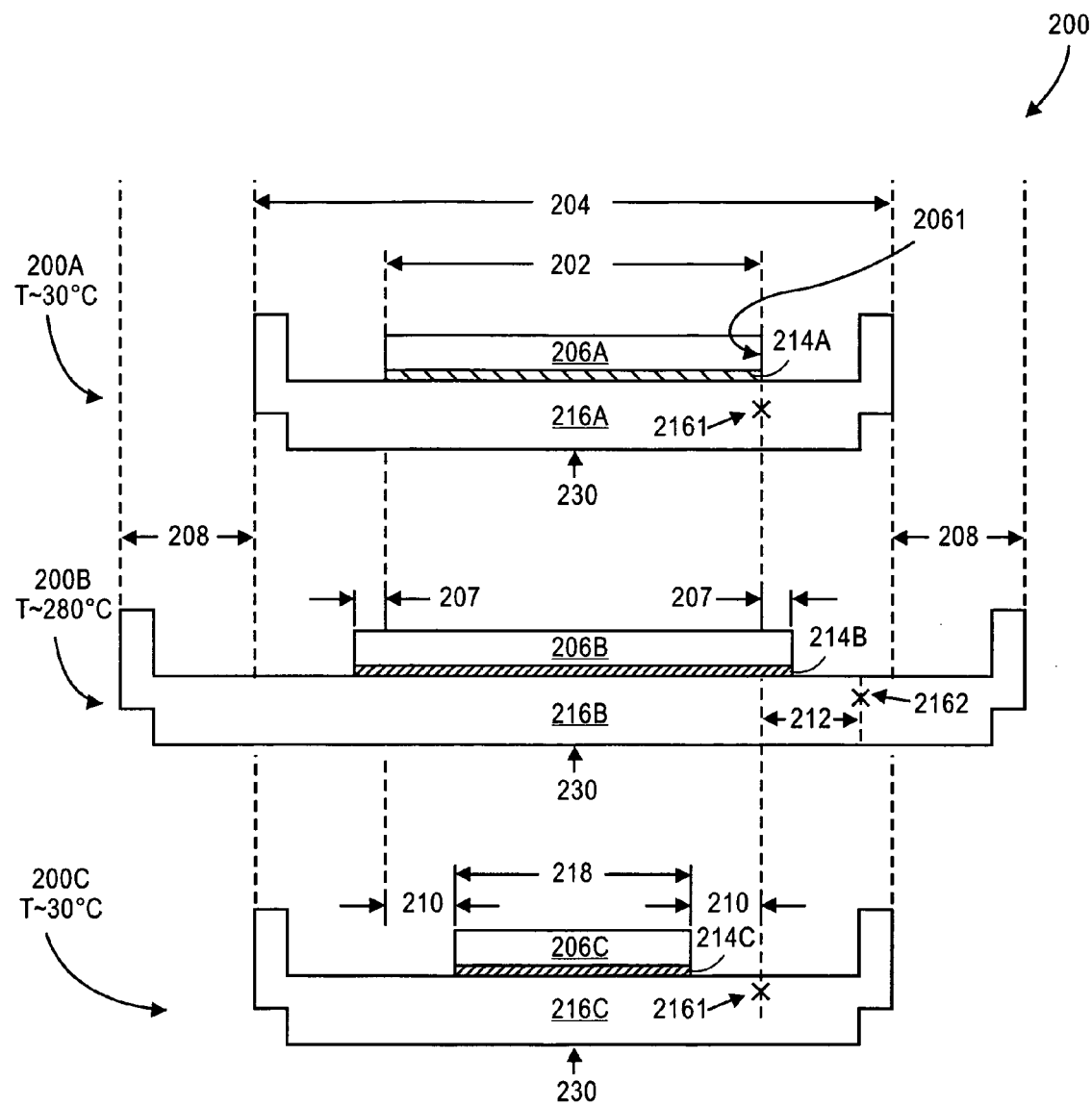
FIG. 2 illustrates successive cross-sectional views of a semiconductor die, a thermal interface material, and an integral heat spreader before, during and after being heated to a temperature capable of melting the thermal interface material.

FIG. 2 illustrates how a conventional die/IHS assembly process can be problematic when using high melting point thermal interface materials (TIMs) such as gold-tin FIG. 2 includes three cross-sectional views (200A, 200B, and 200C) showing relative amounts of die and IHS expansion and contraction at three different stages of attaching a die 206 to an IHS 226. Stages 200A and 200B show that as a result of heating, the IHS 216 and the die 206 expand but by different amounts. As shown in stage 200A, when the temperature (T) is equal to approximately thirty degree Celsius, the die 206A has a width dimension 202 and the IHS 216A has a width dimension 204. Note that the vertical dashed lines associated with dimensions 202 and 204 (200A) have been extended into cross-sectional views 200B and 200C to illustrate the relative directions of expansion and contraction of die and IHS at the subsequent stages of the IHS to die bonding processes.

As shown in 200B, as the IHS 216 and die 206 are heated to approximately two hundred eighty degrees Celsius (i.e., the melting point of the TIM), expansion occurs whereby (1) the width 202 of the die 206A increases by an amount 207 on each side (shown with respect to 206B) and (2) the width 204 of the IHS 216A increases by amount 208 on each side (shown with respect to 216B). As shown in stage 200B, as a result of heating, the IHS 216B expands more than the die 206B. This is indicated here by differences in the relative change in the size of the dimensions of IHS 216 (dimension 208) and die 206 (dimension 207).

Prior to reaching two-hundred eighty degrees Celsius, the TIM 214A is a semi-solid material. After reaching two-hundred eighty degrees Celsius, the TIM melts. Upon cooling/resolidifying, the IHS 216 and the die 206 bond together via solidified TIM 214B and 214C. Stages 200B and 200C show that after the composite IHS/die assembly cools back down to room temperature (approximately thirty degrees Celsius), the IHS 216 contracts back to its original dimensions (i.e. dimension 204). However, because the IHS 216 and the die 206 are now rigidly attached to each other, and because the relatively thick IHS is much stiffer than the thinner silicon die, the IHS's contraction predominates and forces the die 206C to shrink to dimension 218, which is smaller than the original dimension 204 by an amount 210 (on each side of the die 206C). Therefore, the IHS 216C returns to its original dimensions 204 upon cooling, however the die 206C shrinks to a dimension 218, which is smaller than its original dimension 202. The forced size reduction produces a compressive stress in the die that can negatively impact the yield, performance, and reliability of the packaged IC.

In a specific example (for a die having a width dimension 10 mm and an IHS having a width dimension 31 mm at thirty degrees Celsius), as a result of heating the die 206 to melt the TIM, the edges of the die 206A moved outwardly by approximately 3 microns (dimension 207 of 200B) and the edges of the IHS 216A moved outwardly by approximately 75 microns (dimension 208 of 200B). Point 2161 (a point on the IHS that was equidistant with the edge 2061 of die 206A from center point 230 at thirty degrees Celsius) moved outwardly by approximately 25 microns as indicated by point 2162 (dimension 212 of 200B) In other words, to the extent that the edge of the die moved outwardly by only approximately three microns as a result of being heated, a similarly originally equidistant point (to point 2161) on the IHS moved outwardly by approximately 25 microns (to point 2062) as a result of being heated. Then, upon cooling, the edge of the IHS 216B contracts by approximately 75 microns and returns to its original size (dimension 204) as indicated by 216C, and the point 2162 returned approximately to its original position (point 2161) as shown in 200C. However the die 206C, because it is rigidly attached to the IHS 216C, was forced to compress as the IHS 216C contracted. This means that the die 206C shrank by approximately 22 microns (dimension 210) on each side of the die as compared to its original dimension 202 (three microns expansion minus 25 microns contraction equals 22 microns contraction).

Figure 3:
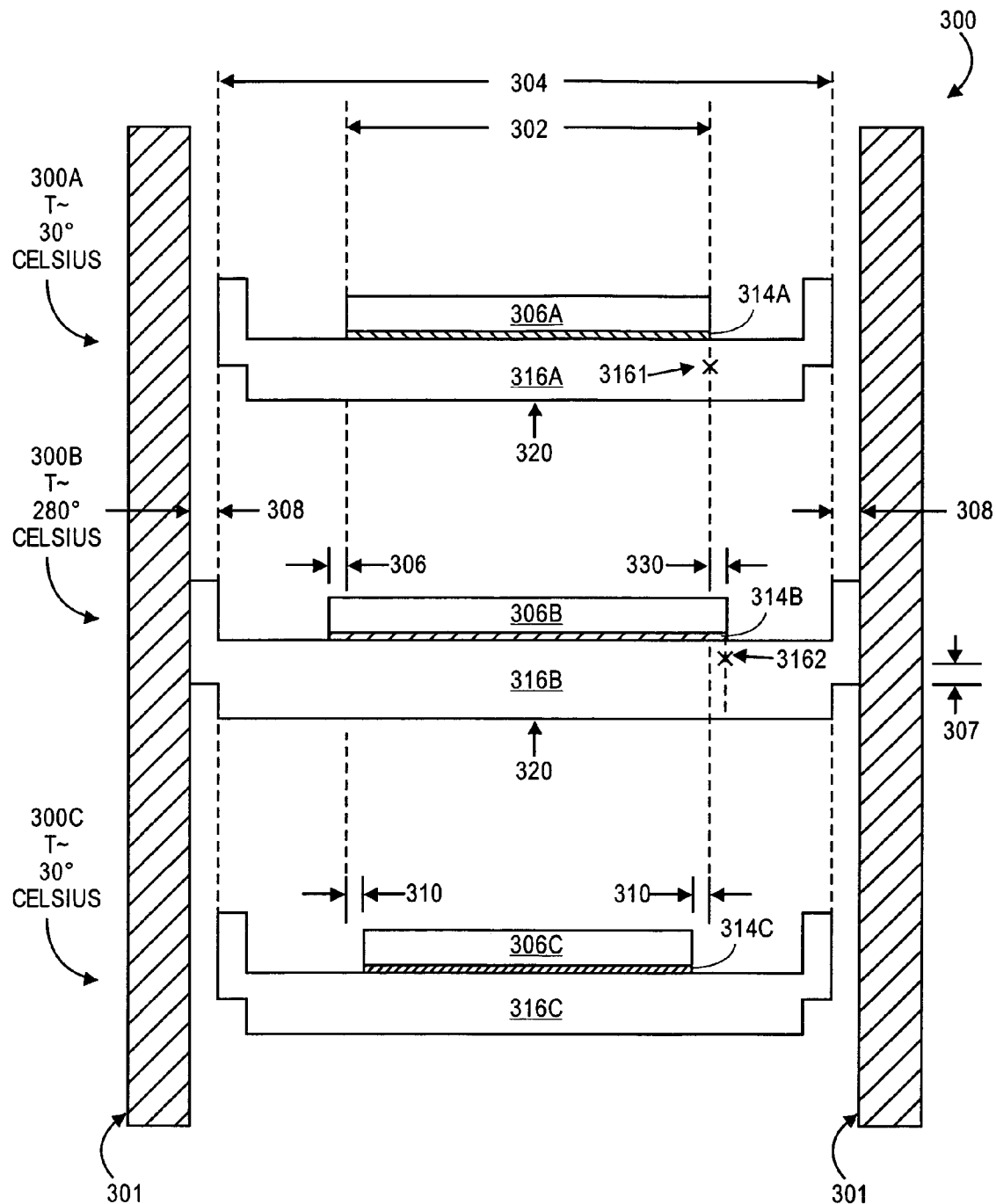
FIG. 3 illustrates successive cross-sectional views of a semiconductor die, a thermal interface material, and an integral heat spreader before, during, and after being heated to a temperature capable of melting the thermal interface material using an embodiment of the present invention.

Turning now to FIG. 3, an embodiment of the present invention is disclosed. FIG. 3, like FIG. 2 includes three cross-sectional views (300A, 300B, and 300C) showing a die/IHS assembly at three different stages of the die-to-IHS bonding process. More specifically, cross-sectional views 300A, 300B, and 300C correspond to the IHS/die assembly at approximately thirty degrees Celsius (prior to bonding), at approximately two-hundred eighty degrees Celsius (the TIM melting point), and at thirty degrees Celsius (after bonding), respectively. FIG. 3 illustrates an effect that an embodiment of the present invention (i.e., a physical constraint 301) can have on reducing die shrinkage and stress.

As shown in FIG. 3, the IHS's lateral thermal expansion (its increase in width dimension) is now restricted by physical constraint 301. The physical constraint can be constructed of a material that is relatively impervious to CTE changes in the temperature ranges being used to bond the IHS and the die or can be achieved by applying external compressive force on IHS. Note that the vertical dashed lines associated with dimensions 302 and 304 (300A) have been extended into cross-sectional views 300B and 300C to illustrate the relative directions of expansion and contraction of die and IHS at the three stages of the IHS to die bonding process. The physical constraint 301 is placed at a distance 308 beyond the edge of the IHS 316A. Initially upon heating above thirty degrees Celsius, the IHS 316A and die 306A will both expand freely. At some point during the heating process, the IHS 316A will expand to the point where it physically contacts constraint 301 (300B). The physical constraint 301 substantially impedes further expansion of the IHS up to and including at the temperature at which the TIM melts. While the lateral dimensions of the IHS 316B are constrained by the physical constraint 302, the vertical dimension can increase or grow by an amount 307 due to the Poisson effect, as known to one of ordinary skill.

As shown in 300B, at two-hundred eighty degrees Celsius, points on the die and the IHS initially equidistant from the center 320 of the assembly (edge of die 306A and point 3161 on IHS 316A) have expanded laterally by approximately the same amount 330 relative to the center of the assembly 320 (i.e., the edge of the die 306B and point 3162). One of ordinary skill appreciates that coordination of the amount of IHS expansion relative to the die can be varied by changing the displacement of the position of the physical constraint 301. At two-hundred eighty degrees Celsius, the TIM solder melts. Upon cooling, the TIM solidifies and thereby bonds the IHS 316 to the die 306. Also upon cooling, the die and IHS can begin to contract.

Initially during cooling there is minimal lateral movement of IHS 316B because compressive stress in the IHS 316B is released by shrinking vertical dimension 307 back towards the IHS's original thickness. During this time, independent contraction of the die 306 may occur in response to the cooling. Typically however, die contraction is limited/controlled by the IHS contraction due to the die-IHS bond. In so far as contraction of the die does occur, it is likely limited by the amount indicated by dimension 330 (i.e. the distance by which die 306A originally expanded to the die shown in 306B). During this portion of the cooling time period (i.e., those portions of the cooling time period, wherein the IHS 316 still contacts the physical constraint 302), it is believed that minimal compressive stress is being induced into the die 306 by the IHS 316.

As the assembly cools to room temperature (i.e. approximately thirty degrees Celsius), the IHS 316B relaxes back to its original dimension 304 (316B). As it does so, it and the die 306 shrink. To the extent that the edge of die 306B and 3162 are equidistant from the center of the die when the die/IHS bond is formed (300B) and minimal/no independent contraction of the die 306B has occurred, then the die 306 will also shrink back to its original dimension 302. If however, there has been any independent contraction of the die 306, then the final lateral dimensions of the die 306 may be smaller than the original lateral dimensions 302, as indicated by die 306C, which has width dimensions that have been reduced beyond dimension 302 by an amount 310. Note however, because the overall expansion of the IHS 306 has been limited via the physical constraint 301, net compression of the die as a result of contraction of the IHS 316 is still less than it would be using conventional die-IHS assembly process of FIG. 2.

One of ordinary skill appreciates that to the extent that additional (or less) compression is desired, the temperature of the die 306 could be independently controlled such that its expansion is more or less than it would be at the melting point of the TIM (i.e. 280 degrees for gold-tin TIMs). Furthermore, one of ordinary skill appreciates that net compression of the die can also be controlled by changing the relative position of the lateral constraints 301 with respect to the IHS. That is, the die's stress can be made to be more or less tensile or compressive, as so desired. This facilitates "tuning" the die's stress to enhance yield, reliability, or performance of the packaged IC. Also, the added control improves die shrinkage repeatability, thereby improving process manufacturing tolerances during subsequent package assembly. Physical constraints 301 are merely illustrative of one way in which expansion of the IHS can be controlled. One of ordinary skill appreciates that the physical constraint can be any external (or internal) barrier that controls, reduces/increases, or limits the amount of thermal expansion of the IHS. So, for example, clamps, fasteners, braces, brackets, fixtures, carriers, molds, etc. can similarly be used to limit thermal expansion of the IHS during the IHS-die mounting process.

In addition to embodiments of the present invention that disclose the use of a rigid stationary physical barrier to limit lateral expansion of the IHS (e.g., physical barrier 301), at least one alternative embodiment contemplates use of an apparatus that can limit lateral expansion of the IHS by exerting a external physical compressive force back onto the IHS. In this way, the apparatus applying the external physical force (e.g. an apparatus having constraints controlled by hydraulic pumps, dynamic molds, etc.,) not only impedes the expansion of the IHS, it can also influence the IHS to take on any number of predetermined dimensions. So, unlike the passive physical constraint 301 shown in FIG. 3, this embodiment can further actively respond to expansion of the IHS by dynamically compressing it along any IHS axis that will help to reduce IHS-cooling induced stress in the attached semiconductor die.

In one specific embodiment the physical constraints 301 can be positioned so they are approximately 10 microns (dimension 308) from the edge of the IHS 316 at room temperature. Upon heating to melt the TIM, the die and the IHS expand. Lateral expansion of the IHS beyond 10 microns is restricted by the constraint 301. However, lateral expansion of the die 306 can occur without restriction. Here the die can expand laterally by approximately 3 microns (dimension 306B). After the IHS laterally expands to contact the constraint 301, compressive stress builds up in the IHS because further lateral expansion is inhibited. Consequently, the IHS exhibits vertical expansion 307. Upon reaching the melting point of the TIM, the TIM melts. Then, upon cooling below melting point, the die and IHS bond together. During this stage of the cooling process (i.e., while the IHS physically contacts the constraint 301), limited IHS-induced compression of the die occurs. After the IHS contracts to the point where it no longer contacts the constraint 301, then the edge of the IHS and the edge of the die can physically contract simultaneously. To the extent that the amount of IHS expansion at point 3162 matches the amount of expansion measured at the edge of the die (i.e. approximately 3 microns), then upon reaching room temperature, the IHS 316 and the die 306 will return approximately to their original dimensions 304 and 302, respectively. In this way, minimal and/or controllable level of stress is generated in the die.

Finite element analysis was carried out on the foregoing physically constrained die/IHS assembly processes of FIG. 3 and the unconstrained assembly process of FIG. 2 to compare resulting levels of stress in the die. In both cases the die and IHS were heated from room temperature (approximately 30 degrees Celsius) to two-hundred eighty degrees Celsius (to melt the TIM solder) and then cooled to room temperature. Die stresses were then measured at room temperature. In the case where no physical constraint was used, resulting die stresses ranged from 0–600 Pascals compressive. In the case where physical constraint 301 was used, resulting die stresses ranged from 0–125 Pascals tensile. These results are indicative of how, using one embodiment of the present invention, compressive die stress can be reduced and/or modulated.

Figure 4:
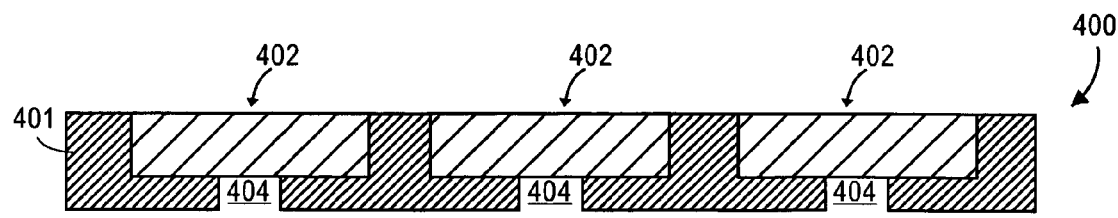
FIGS. 4–5 illustrate cross-sectional and top down views, respectively of an example carrier that can be used to assemble integral heat spreaders and semiconductor die in accordance with an embodiment of the present invention.
Figure 5:
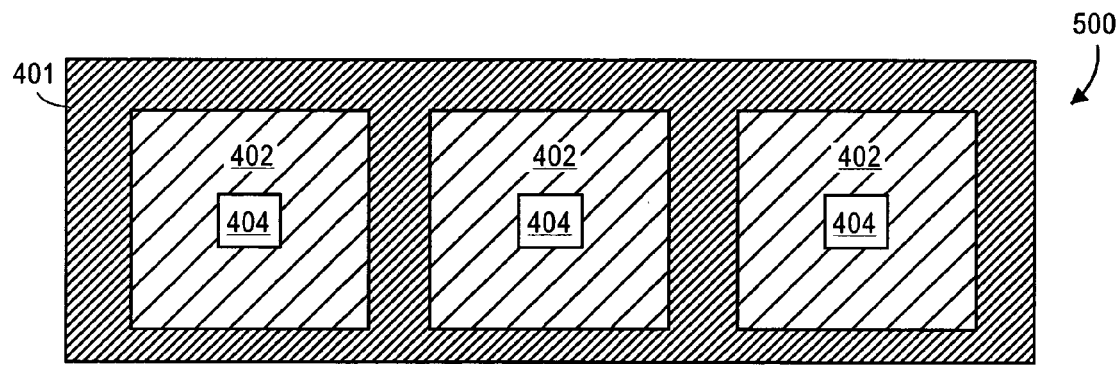

In one embodiment, the physical constraint can be made manufacturable by using specially machined carrier for the die-to-IHS bonding process. These carriers laterally constrain the IHS during the heating and cool down processes. An example of such a carrier is shown in FIGS. 4 and 5. FIG. 4 includes a cross-sectional view 400 of a carrier 401 and FIG. 5 is a top-down view 500 of the carrier 401. The carrier 401 is preferably machined out of material that has high elastic modulus and low coefficient of thermal expansion (CTE). The surface finish of the faces of the carrier are preferably tightly controlled in order to accurately space the gap between outer boundary of IHS and inner boundary of carrier cavity. This gap will control amount of compression on IHS during assembly process. As can be seen in FIGS. 4 and 5, the carrier 401 includes a cavity 402 for placement of the IHS and the die. Through hole 404 can be used to center the IHS during the mounting process, as an expansion slot, and/or to facilitate ejecting the molded die/IHS assembly from the carrier 401.

Figure 6:
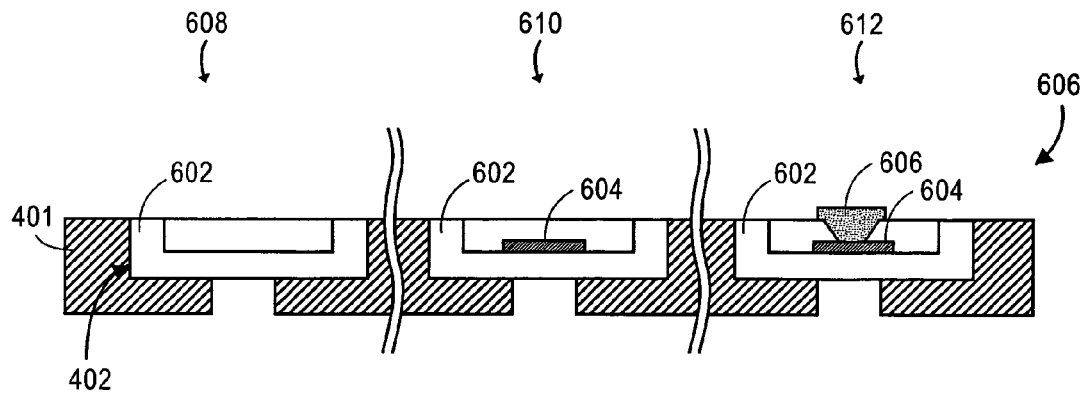
FIG. 6 illustrates a cross-sectional view of portions of the carrier of FIGS. 4–5, showing various stages of assembling an integral heat spreader and semiconductor die.
Figure 7:
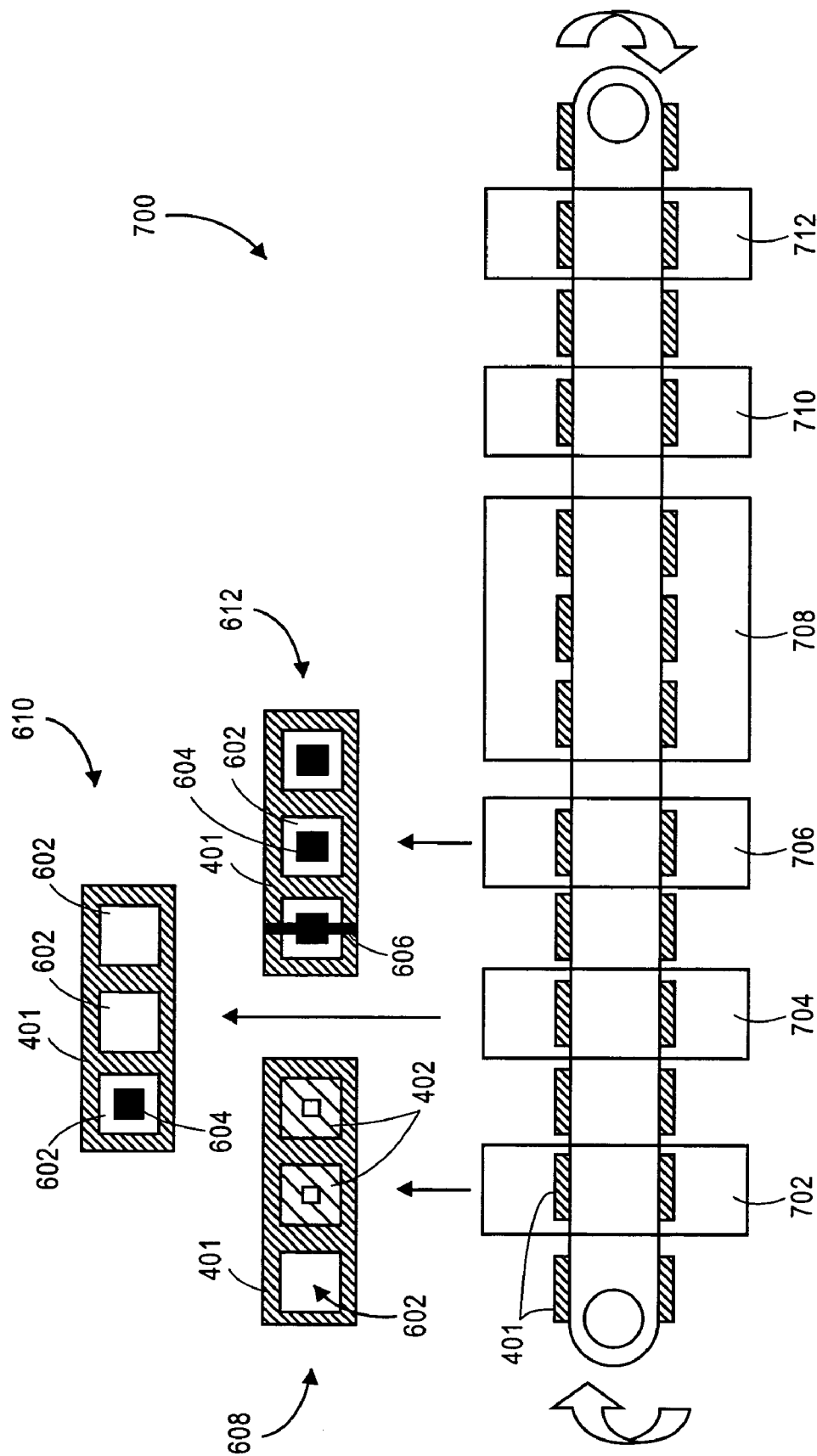
FIG. 7 illustrates how an assembly process using the carrier of FIGS. 4–5 can be used to mount integral heat spreaders and semiconductor die.

Referring now to FIG. 6, segmented portions of a carrier are illustrated at various steps during a die-IHS mounting process. In step 608, the IHS 602 is put in the cavity 402 (for ease of illustration and simplicity of discussion, the gap between outer boundary of IHS and inner boundary of carrier cavity is not shown); in step 610, the die 604 is placed on the IHS 602; and in step 612, the die 604 and IHS 602 are clamped or clipped in place via retaining mechanism 606. The carrier of FIGS. 4–6 can be integrated into an assembly process for attaching integral heat spreaders to semiconductor die. Shown in FIG. 7 is an example of such an assembly process. In FIG. 7, a plurality of carriers 401 are used in a rotating conveyor 700 to mount semiconductor die 604 to integral heat spreaders 602. At one end of the rotating conveyor 700, pick and place tools can sequentially place the IHS 602, die 604, and retaining clips 606 in/on the carrier 401. The die/IHS assemblies are then heated and then cooled and removed from the rotating conveyor 700 at the other end.

More specifically, at one end of the rotating conveyor 700 pick and place tool 702 can place integral heat spreaders 602 in cavities 402 of the carrier tray 401, as indicated by the IHS 602 being put in the left-most cavity of carrier 401 (step 608). Then, a second pick-and-place tool 704 puts die 604 on the IHS 602, as indicated by die 604 being put on the IHS 602 in the left-most cavity of carrier 401 (Step 610). Note that the TIM (not shown) can be put on the die 604 and/or the IHS 602 prior to putting the die on the IHS. In 706, a third pick-and-place tool places retaining clips 606 over the die 604 and IHS 602 to hold the die and IHS in place, as indicated by clip 606 being put on the die 604 and IHS 602 in the left-most cavity of carrier 401 (step 612). Then, the carrier 401 can be sent through an oven 708 to melt the TIM and whereupon cooing, a bond is formed between the TIM and the IHS. After the cooled die/IHS exit the oven, the clips can be removed (step 710) and finally in step 712, the bonded die-IHS assembly can be removed from the carrier. At this point the carrier is ready for the next cycle of die-IHS assembly process.

A method and apparatus for lowering compressive stress induced in a semiconductor die during IHS-to-die assembly has been disclosed. The disclosed method and apparatus may be advantageous when using high-temperature thermal interface materials and/or thin semiconductor die thermal interface material technology to mount semiconductor die on integral heat spreaders. In particular, relatively higher melting point thermal interface materials, such as gold-tin solders can now be used without experiencing problems with excessive compressive stress being generated in the die. The ability to use thermal interface materials that have higher melting points than that of the C4 bumps (first level interconnects) can have technical advantages during subsequent assembly of the die and packaging substrate. The die-IHS assembly can provide stability for the thin die while mounting the die to the packaging substrate, and it can also eliminate problems with epoxy (from excess underfill material) contaminating the backside of the thin die after the C4 bump bonding process.

The various implementations described above have been presented by way of example and not by way of limitation. Thus, for example, while embodiments disclosed herein reference flip-chip mounted semiconductor devices in BGA packages. One of ordinary skill appreciates that semiconductor devices which have been mounted to a substrate using other techniques or using other package types (e.g., pin grid array (PGA) packages, land grid array (LGA) packages, or any package-type that uses an IHS mounted to a die) can advantageously use integral heat spreaders and die incorporating one or more embodiments of the present invention to improve package reliability. The embodiments disclosed herein are not necessarily limited to the use of TIMs wherein the TIM melting point is significantly greater than the temperature used to attach die bumps to the packaging substrate. The embodiments herein can be used with any type of TIM to produce lower IHS induced die stress as compared to conventional free-state IHS/die bonding processes.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for reducing stress in a semiconductor die comprising:
   heating a thermal interface material;
   independently controlling a temperature of the semiconductor die so that a width expansion of the semiconductor die is greater than it would otherwise be at a melting point of the thermal interface material;
   constraining thermal expansion of a heat spreader while heating including restricting the lateral thermal expansion of the heat spreader with a physical restraint;
   melting the thermal interface material;
   cooling the thermal interface material; and
   bonding the semiconductor die to the heat spreader via the thermal interface material.

2. The method of claim 1, wherein the physical restraint includes a material that is relatively impervious to coefficient of thermal expansion changes at temperatures used to heat and melt the thermal interface material.

3. The method of claim 1, wherein the physical restraint is further characterized as a carrier that includes a cavity for placement of the integral heat spreader.

4. The method of claim 1, wherein the physical constraint is further characterized as an external compressive force applied to the integral heat spreader.

5. The method of claim 4, wherein the external compressive force can be varied in response to the amount of lateral expansion of the integral heat spreader.

6. The method of claim 1, wherein the external compressive force includes one or more of clamps, fasteners, braces, brackets, fixtures, carriers, and molds.

7. The method of claim 1, wherein the physical constraint is positioned at a distance from the edge of the integral heat spreader before heating, and wherein:
   before heating, the die has a first width dimension;
   during melting the die has a second width dimension; and
   after bonding the die has a third width dimension, wherein the second width dimension is greater than the first width dimension and the third width dimension is approximately equal to the first width dimension.

8. The method of claim 1, wherein the physical constraint is positioned at a distance from the edge of the integral heat spreader before heating, and wherein:
   before heating, the die has a first width dimension;
   during melting the die has a second width dimension; and after bonding the die has a third width dimension, wherein the second width dimension is greater than the first width dimension and the third width dimension is less than the first width dimension.

9. The method of claim 1, wherein the physical constraint is positioned at a distance from the edge of the integral heat spreader before heating, and wherein:
before heating, the die has a first width dimension;
during melting the die has a second width dimension; and
after bonding the die has a third width dimension, wherein the second width dimension is greater than the first width dimension and the third width dimension is greater than the first width dimension.

10. The method of claim 1, wherein during restricting the lateral thermal expansion of the heat spreader, a vertical dimension of the heat spreader increases.

11. A method of packaging a semiconductor die comprising:
placing an integral heat spreader in a physical constraint;
placing a die on the integral heat spreader;
heating the integral heat spreader;
constraining a lateral thermal expansion of the integral heat spreader during a portion of the heating;
bonding the integral heat spreader and the die together while constraining; and
removing the bonded integral heat spreader and die from the physical constraint.

12. The method of claim 11, wherein the physical constraint includes a carrier having a cavity, wherein the IHS is put into the cavity, and wherein a bonded IHS and die are removed from the cavity.

13. The method of claim 12, wherein the carrier is one of a plurality of carriers used in a rotating conveyor.

14. A method of packaging a semiconductor die comprising:
bonding a integral heat spreader to a semiconductor die via a thermal interface material; and
bonding a combination integral heat spreader-semiconductor die to a packaging substrate.

15. The method of claim 14, wherein the thermal interface material has a melting point that is greater than a melting point of bumps used to bond the semiconductor die to the packaging substrate.

16. The method of claim 15, wherein the thermal interface material is further characterized as a gold-tin solder and wherein the bumps are further characterized as a lead-tin solder.

* * * * *

UNITED STATES PATENT AND TRADEMARK OFFICE
CERTIFICATE OF CORRECTION

| | | |
|---|---|---|
| PATENT NO. | : 7,166,540 B2 | Page 1 of 1 |
| APPLICATION NO. | : 11/072112 | |
| DATED | : January 23, 2007 | |
| INVENTOR(S) | : Deshpande et al. | |

It is certified that error appears in the above-identified patent and that said Letters Patent is hereby corrected as shown below:

Title Page, Item (57), at line 7 of the Abstract, delete "hat" and insert --heat--.

In column 9, at line 19, after "spreader" insert --(IHS)--.

Signed and Sealed this

Fifteenth Day of April, 2008

JON W. DUDAS
*Director of the United States Patent and Trademark Office*